United States Patent
Hosoba et al.

[11] Patent Number: 5,111,470
[45] Date of Patent: May 5, 1992

[54] SEMICONDUCTOR LASER DEVICE AND A METHOD OF FABRICATING THE SAME

[75] Inventors: Hiroyuki Hosoba, Nara; Akinori Seki, Toyota; Toshio Hata, Nara; Masafumi Kondou, Nara; Takahiro Suyama, Yamatokoriyama; Sadayoshi Matsui, Tenri, all of Japan

[73] Assignee: Sharp Kabushiki Kaisha, Osaka, Japan

[21] Appl. No.: 685,415

[22] Filed: Apr. 12, 1991

[30] Foreign Application Priority Data

Apr. 13, 1990 [JP] Japan ................................ 2-99012

[51] Int. Cl.$^5$ ............................................. H01S 3/19
[52] U.S. Cl. .................................. 372/46; 372/45; 372/50
[58] Field of Search ........................... 372/43–46, 372/50

[56] References Cited

U.S. PATENT DOCUMENTS

| | | | |
|---|---|---|---|
| 4,813,051 | 3/1989 | Taneya et al. | 372/46 |
| 4,856,013 | 8/1989 | Iwano et al. | 372/45 |
| 4,868,838 | 9/1989 | Yamamoto | 372/46 |
| 4,984,244 | 1/1991 | Yamamoto et al. | 372/45 |
| 5,042,044 | 8/1991 | Kondo et al. | 372/45 |

FOREIGN PATENT DOCUMENTS

031808 7/1981 European Pat. Off. .
142845 5/1985 European Pat. Off. .

OTHER PUBLICATIONS

Sakiyama et al., *JEE Journal of Electronic Engineering* (1989) 26(270):40–42.

Patent Abstracts of Japan (1985) vol. 9, No. 115 & JP-A-60 003178 (1985).
Watanabe et al., *Appl Phys Lett* (1985) 46(11):1023–1025.

*Primary Examiner*—Leon Scott, Jr.
*Attorney, Agent, or Firm*—Morrison & Foerster

[57] ABSTRACT

A semiconductor laser device is provided which includes a semiconductor substrate and a multi-layered structure disposed on the substrate, the multi-layered structure containing an $Al_xGa_{1-x}As$ ($0<x<1$) first cladding layer formed on the substrate, an $Al_yGa_{1-y}As$ ($0<y<1$, $x>y$) active layer for laser oscillation formed on the first cladding layer, an $Al_xGa_{1-x}As$ ($0<x<1$) second cladding layer formed on the active layer, and an $Al_zGa_{1-z}As$ ($0<z<1$) current blocking layer formed above the second cladding layer, the current blocking layer having a striped groove as a current injection path. The method includes the steps of: forming a multi-layered structure on a semiconductor substrate, the multi-layered structure containing in order, an $Al_xGa_{1-x}As$ ($0<x<1$) first cladding layer, an $Al_yGa_{1-y}As$ ($0<y<1$, $x>y$) active layer for laser oscillation, an AlGaAs ($0<x<1$) second cladding layer, a GaAs buffer layer, an $Al_uGa_{1-u}As$ ($0<u<1$) etching stopper layer, an $Al_zGa_{1-z}As$ ($0<z<1$, $z<u$) current blocking layer, and a GaAs protective layer; etching the protective layer and the current blocking layer to form a striped groove as a current injection path; removing the exposed portion of the etching stopper layer on the bottom of the striped groove; removing the portion of the buffer layer on the bottom of the striped groove and at least one part of the protective layer by a melt-back technique; and growing an $Al_xGa_{1-x}As$ ($0<x<1$) third cladding layer so as to bury the striped groove therein and growing a GaAs contact layer on the third cladding layer.

5 Claims, 8 Drawing Sheets

SEMICONDUCTOR LASER DEVICE AND A METHOD OF FABRICATING THE SAME

BACKGROUND OF THE INVENTION

1. Field of the Invention

This invention relates to an AlGaAs semiconductor laser device with high reliability, and it also relates to a method for the production of such a semiconductor laser device.

2. Description of the Prior Art

There have been widely used semiconductor laser devices with a buried groove forming a current injection path, which are referred to as buried-type semiconductor laser devices. A conventional process of producing a semiconductor laser device of this type is shown in FIGS. 3A to 3C.

First, as shown in FIG. 3A, on an n-GaAs substrate 1, an n-$Al_{0.5}Ga_{0.5}As$ first cladding layer 21, an $Al_{0.14}Ga_{0.86}As$ active layer 3, a p-$Al_{0.5}Ga_{0.5}As$ second cladding layer 22, and an n-GaAs current blocking layer 62 are successively formed by an epitaxial growth technique. Next, a photoresist pattern 102 with a striped opening is formed on the n-GaAs current blocking layer 62 which is then selectively etched in such a manner that the etching is allowed to stop at the surface of the p-$Al_{0.5}Ga_{0.5}As$ second cladding layer 22, to form a striped groove as shown in FIG. 3B.

After removing the photoresist pattern 102, a p-$Al_{0.5}Ga_{0.5}As$ third cladding layer 23 and a p-GaAs contact layer 7 are successively grown by an epitaxial growth technique, as shown in FIG. 3C. Finally, an n-side electrode 92 is formed on the bottom surface of the n-GaAs substrate 1, and a p-side electrode 91 on the top surface of the p-GaAs contact layer 7, resulting in a semiconductor laser device.

However, in this production process, the surface of the p-$Al_{0.5}Ga_{0.5}As$ second cladding layer 22, which forms the bottom of the striped groove, is oxidized through exposure to air during the time between the etching of the n-GaAs current blocking layer 62 and the successive growth of the p-$Al_{0.5}Ga_{0.5}As$ third cladding layer 23 and the p-GaAs contact layer 7. The layer grown by an epitaxial growth technique on the oxidized surface of the p-$Al_{0.5}Ga_{0.5}As$ second cladding layer 22 consequently has many crystal defects in the vicinity of the interface therebetween.

Such a problem occurs if any epitaxial growth technique, such as liquid-phase epitaxy (LPE), molecular beam epitaxy (MBE), or metal-organic chemical vapor deposition (MOCVD), is used. Most of these crystal defects create deep energy states, so that when the semiconductor laser device having such crystal defects is operated, part of the generated laser light is trapped by the deep states and converted into heat, thereby causing an increase in the temperature in the vicinity of the active layer. Furthermore, these crystal defects act as non-radiative recombination centers, thereby reducing the amount of light emission and thus resulting in the deterioration of the device characteristics.

To solve these problems, there is a known method which utilizes the property of GaAs having a tendency to melt back by the LPE method. For example, an AlGaAs semiconductor laser device is produced by the process shown in FIGS. 4A to 4E.

First, as shown in FIG. 4A, on an n-GaAs substrate 1, an n-$Al_{0.5}Ga_{0.5}As$ first cladding layer 21, an $Al_{0.14}Ga_{0.86}As$ active layer 3, a p-$Al_{0.5}Ga_{0.5}As$ second cladding layer 22, a p-GaAs buffer layer 4, a p-$Al_{0.5}Ga_{0.5}As$ etching stopper layer 5, and an n-GaAs current blocking layer 62 are successively grown by an appropriate epitaxial growth technique. Next, a photoresist pattern 102 with a striped opening is formed on the n-GaAs current blocking layer 62 which is then selectively etched by an ammonia etchant in such a manner that the etching is allowed to stop at the surface of the p-$Al_{0.5}Ga_{0.5}As$ etching stopper layer 5, to form a striped groove as shown in FIG. 4B.

After removing the photoresist pattern 102, the substrate is immersed in an aqueous solution of hydrofluoric acid to remove the portion of the p-$Al_{0.5}Ga_{0.5}As$ etching stopper layer 5 on the bottom of the striped groove, as shown in FIG. 4C. The wafer thus processed is then inserted into an LPE apparatus in which the wafer is placed in contact with a Ga-Al-As melt to allow the surface of the n-GaAs current blocking layer 62 and the portion of the p-GaAs buffer layer 4 on the bottom of the striped groove to melt back, thereby exposing the p-$Al_{0.5}Ga_{0.5}As$ second cladding layer 22 at the bottom of the striped groove. Then, using the same LPE apparatus, a p-AlGaAs third cladding layer 23 and a p-GaAs contact layer 7 are successively grown. Finally, an n-side electrode 92 is formed on the bottom surface of the n-GaAs substrate 1, and a p-side electrode 91 on the top surface of the p-GaAs contact layer 7, resulting in a semiconductor laser device as shown in FIG. 4D.

In the above-described melt-back process using the Ga-Al-As melt, the p-GaAs buffer layer 4 present on the bottom of the striped groove does not melt back satisfactorily, but rather, the n-GaAs current blocking layer 62 forming the shoulders of the striped groove melts back to a large extent. For example, the p-GaAs buffer layer 4 may remain with almost no melt-back, while the n-GaAs current blocking layer 62 forming the shoulders of the striped groove melts back to increase the width of the striped groove, resulting in a semiconductor laser device with a structure as shown in FIG. 4E.

Furthermore, the width of the striped groove depends on the degree of distributed supersaturation of the Ga-Al-As melt, etc., and varies from groove to groove within the same wafer. Because the p-GaAs buffer layer 4 remaining on the bottom of the striped groove absorbs the light generated from the $Al_{0.14}Ga_{0.86}As$ active layer 3, there occurs a decrease in the intensity of light emission. Even if the p-GaAs buffer layer 4 is made extremely thin and completely melted back, there still occurs a variation in the width of the striped groove, thereby causing a variation in the threshold current and thus reducing the product yield.

SUMMARY OF THE INVENTION

The semiconductor laser device, which overcomes the above-discussed and numerous other disadvantages and deficiencies of the prior art, comprises a semiconductor substrate and a multi-layered structure disposed on the substrate, said multi-layered structure containing an $Al_xGa_{1-x}As$ ($0<x<1$) first cladding layer, an $Al_yGa_{1-y}As$ ($0<y<1, x>y$) active layer for laser oscillation formed on the first cladding layer, an $Al_xGa_{1-x}As$ ($0<x<1$) second cladding layer formed on the active layer, and an $Al_zGa_{1-z}As$ ($0<z<1$) current blocking layer formed above the second cladding layer, the current blocking layer having a striped groove as a current injection path.

In a preferred embodiment, the aforementioned multi-layered structure further contains a GaAs light-absorbing layer formed underneath the current blocking layer.

In a preferred embodiment, the aforementioned Al mole fraction z in the current blocking layer ranges from 0.05 to 0.40.

The method for the production of a semiconductor laser device according to this invention comprises the steps of: forming a multi-layered structure on a semiconductor substrate, the multi-layered structure containing in order, an $Al_xGa_{1-x}As$ ($0<x<1$) first cladding layer, an $Al_yGa_{1-y}As$ ($0<y<1, x>y$) active layer for laser oscillation, an AlGaAs ($0<x<1$) second cladding layer, a GaAs buffer layer, an $Al_uGa_{1-u}As$ ($0<u<1$) etching stopper layer, an $Al_zGa_{1-z}As$ ($0<z<1, z<u$) current blocking layer, and a GaAs protective layer; etching the protective layer and the current blocking layer to form a striped groove for a current injection path; removing the exposed portion of the etching stopper layer on the bottom of the striped groove; removing the portion of the buffer layer on the bottom of the striped groove and at least one part of the protective layer by a melt-back technique; and growing an $Al_xGa_{1-x}As$ ($0<x<1$) third cladding layer so as to bury the striped groove therein and growing a GaAs contact layer on the third cladding layer.

In a preferred embodiment, a GaAs light-absorbing layer is formed between the etching stopper layer and the current blocking layer, and the light-absorbing layer is etched together with the protective layer and the current blocking layer.

Thus, the invention described herein makes possible the objectives of (1) providing an AlGaAs semiconductor laser device with high reliability, in which there occurs no heat-up in the vicinity of the active layer or no decrease in the amount of light emission, associated with crystal defects, and there are no variations in the width of the current injection path; and (2) providing a method for the production of such a semiconductor laser device with an increased production yield.

BRIEF DESCRIPTION OF THE DRAWINGS

This invention may be better understood and its numerous objectives and advantages will become apparent to those skilled in the art by reference to the accompanying drawings as follows.

DESCRIPTION OF THE PREFERRED EMBODIMENTS

As described above, the semiconductor laser device of this invention has a multi-layered structure disposed on a semiconductor substrate. The multi-layered structure contains an $Al_xGa_{1-x}As$ ($0<x<1$) first cladding layer, an $Al_yGa_{1-y}As$ ($0<y<1, x>y$) active layer for laser oscillation formed on the first cladding layer, an $Al_xGa_{1-x}As$ ($0<x<1$) second cladding layer formed on the active layer, and an $Al_zGa_{1-z}As$ ($0<z<1$) current blocking layer formed above the second blocking layer. The current blocking layer has a striped groove as a current injection path.

In the method for the production of such a semiconductor laser device according to this invention, a multi-layered structure is formed on a semiconductor substrate, the multi-layered structure containing in order, an $Al_xGa_{1-x}As$ ($0<x<1$) first cladding layer, an $Al_yGa_{1-y}As$ ($0<y<1, x>y$) active layer for laser oscillation, an AlGaAs ($0<x<1$) second cladding layer, a GaAs buffer layer, an $Al_uGa_{1-u}As$ ($0<u<1$) etching stopper layer, an $Al_zGa_{1-z}As$ ($0<z<1, z<u$) current blocking layer, and a GaAs protective layer. Then, the protective layer and the current blocking layer are etched to form a striped groove for a current injection path. After removing the exposed portion of the etching stopper layer on the bottom of the striped groove, the portion of the buffer layer on the bottom of the striped groove and at least one part of the protective layer are removed by a melt-back technique, after which an $Al_xGa_{1-x}As$ ($0<x<1$) third cladding layer is grown so as to bury the striped groove therein and a GaAs contact layer is grown on the third cladding layer.

Because the current blocking layer is formed from $Al_zGa_{1-z}As$ ($0<z<1$), there is no possibility of melting back this layer with a Ga-Al-As melt. It is therefore possible to allow the GaAs buffer layer to completely melt back, and as a result, no variations are caused in the width of the striped groove or current injection path. Also, because the GaAs buffer layer is not left unremoved on the bottom of the striped groove, there is no possibility that the buffer layer absorbs the light generated from the active layer, reducing the amount of light emission. Furthermore, because the third cladding layer is grown immediately after the melt-back of the buffer layer, there is no possibility of causing crystal defects in the vicinity of the interface between the second cladding layer and the third cladding layer, nor are there any problems associated with crystal defects.

The Al mole fraction z in the $Al_zGa_{1-z}As$ current blocking layer is preferably set within the range of 0.01 to 0.40, although it depends not only on the condition for etching the striped groove but also on the Al mole fraction in the etching stopper layer.

Figure 5A:
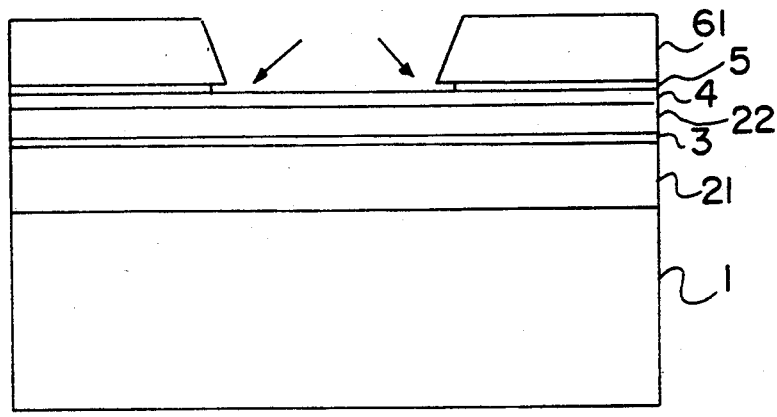
FIGS. 5A and 5B are sectional views showing a problem associated with a high Al mole fraction of the current blocking layer.
Figure 5B:
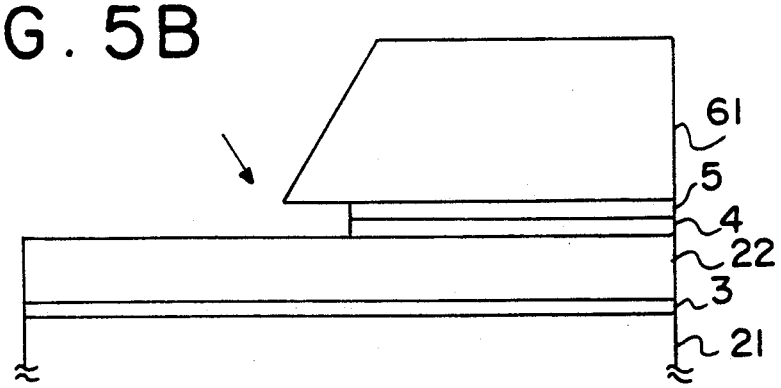

When the Al mole fraction z in the $Al_zGa_{1-z}As$ current blocking layer is greater than 0.2, the following problems may occur. After etching the striped groove, the $Al_uGa_{1-u}As$ ($0<u<1$) etching stopper layer is removed using, for example, an aqueous solution of hydrofluoric acid. If, at this time, the GaAs buffer layer is not exposed by completely removing the etching stopper layer on the bottom of the striped groove, it will be difficult to allow the GaAs buffer layer to melt back in the subsequent step. Therefore, when removing the $Al_uGa_{1-u}As$ ($0<u<1$) etching stopper layer, overetching readily occurs as shown in FIG. 5A. When the wafer thus overetched is allowed to melt back using a Ga-Al-As melt, the $Al_uGa_{1-u}As$ ($0<u<1$) etching stopper layer and the GaAs buffer layer become recessed as shown in FIG. 5B, because the $Al_zGa_{1-z}As$ ($0<z<1$) current blocking layer is hard to melt back. In this situation, when the $Al_xGa_{1-x}As$ ($0<x<1$) third cladding layer and the GaAs contact layer are grown, the crystal growth does not proceed satisfactorily at the recessed portions, and therefore, epitaxial imperfections have a tendency to occur at these portions.

To solve the above-mentioned problems, a light absorbing layer formed from GaAs may be provided underneath the current blocking layer. Because the light absorbing layer is allowed to melt back together with the GaAs buffer layer, the etching stopper layer can be prevented from becoming recessed.

The invention will be further illustrated by reference to the following examples, but these examples are not intended to restrict the invention. In these examples, Al mole fractions in the respective AlGaAs layers may be altered, when necessary.

EXAMPLE 1

Figure 1A:
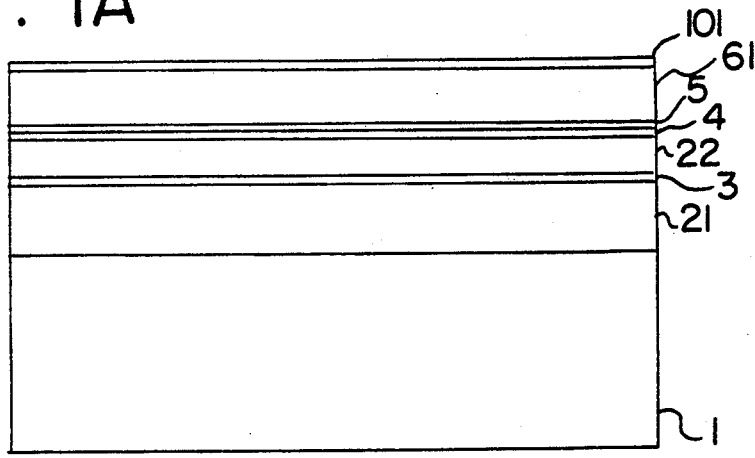
FIGS. 1A to 1E are sectional views showing the production of a semiconductor laser device according to a method of this invention.

FIGS. 1A to 1D show a series of steps in a method for the production of a semiconductor laser device according to this invention. The semiconductor laser device was produced as follows:

(1) As shown in FIG. 1A, on an n-GaAs substrate 1, an n-$Al_{0.50}Ga_{0.50}As$ first cladding layer 21, an $Al_{0.14}Ga_{0.86}As$ active layer 3, a p-$Al_{0.50}Ga_{0.50}As$ second cladding layer 22, a p-GaAs buffer layer 4, an n-$Al_{0.60}Ga_{0.40}As$ etching stopper layer 5, an n-$Al_{0.10}Ga_{0.90}As$ current blocking layer 61, and an n-GaAs protective layer 101 were successively grown by the MBE method. The use of the MBE method makes it possible to obtain an active layer with a superlattice structure because of its ability to form a steep interface. Also, the first and second cladding layers can be formed into either an SCH or a GAIN-SCH structure. However, other epitaxial growth techniques, such as the MOCVD and the LPE methods, can also be used.

Figure 1B:
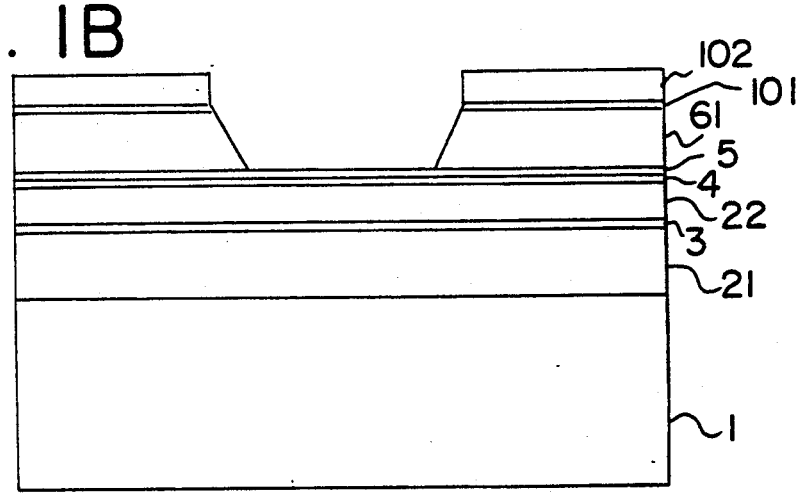

(2) A photoresist pattern 102 with a striped opening was formed on the n-GaAs protective layer 101. Using the photoresist pattern 102 as an etching mask, the n-GaAs protective layer 101 and the n-$Al_{0.10}Ga_{0.90}As$ current blocking layer 61 were etched by photolithography, to form a striped groove reaching the n-$Al_{0.60}Ga_{0.40}As$ etching stopper layer 5, as shown in FIG. 1B. A GaAs selective etchant, such as a mixture of ammonia water and hydrogen peroxide, was used in the etching. When the Al mole fraction in the current blocking layer is 0.3 or lower, the current blocking layer can be etched using such an etchant. On the other hand, when the Al mole fraction is greater than 0.3, an aqueous solution of sulfuric acid and hydrogen peroxide or an aqueous solution of hydrochloric acid is used as the etchant. The cross-sectional shape of the striped groove shown in FIG. 1B is in the form of a mesa, but alternatively, it may be a reversed mesa form.

Figure 1C:
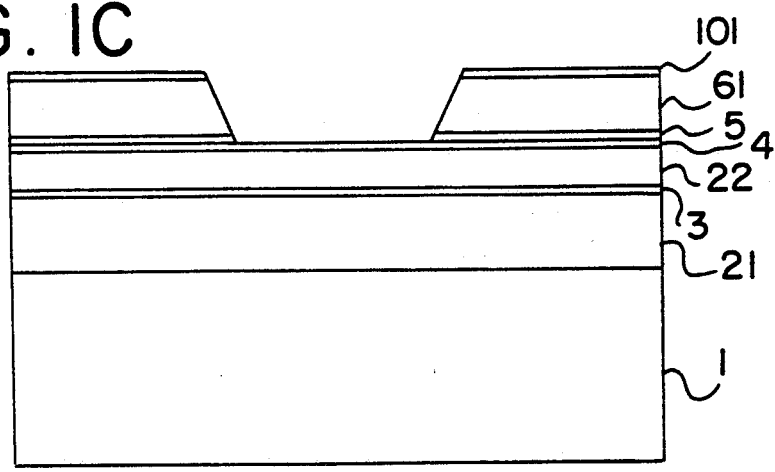

(3) After removing the photoresist pattern 102, the above-described wafer was immersed in an AlGaAs selective etchant, such as an aqueous solution of hydrofluoric acid, to remove the exposed portion of the n-$Al_{0.60}Ga_{0.40}As$ etching stopper layer 5 on the bottom of the striped groove, as shown in FIG. 1C. The Al mole fraction in the current blocking layer is preferably set within the range of 0.05 to 0.40 so that the current blocking layer 61 will not be etched away simultaneously.

Figure 1D:
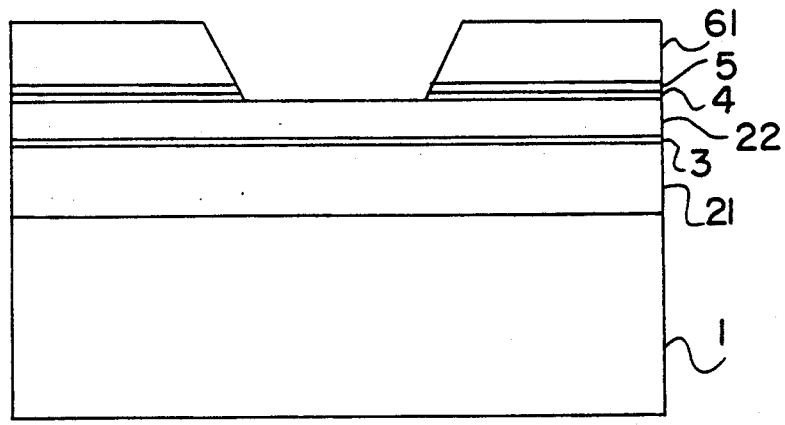

(4) The wafer thus processed was inserted into an LPE apparatus in which the wafer was placed in contact with a Ga-Al-As melt to allow the GaAs layers to melt back. The AlGaAs layers are hard to melt back, even if the Al mole fraction is low. As a result, the n-GaAs protective layer 101 and the portion of the p-GaAs buffer layer 4 on the bottom of the striped groove were removed by melt-back, as shown in FIG. 1D.

The n-GaAs protective layer 101 does not necessarily have to be removed entirely. On the other hand, it is desirable that the portion of the p-GaAs buffer layer 4 on the bottom of the striped groove be completely removed to expose the p-$Al_{0.50}Ga_{0.50}As$ second cladding layer 22 at the bottom of the striped groove. However, because the buffer layer is of the same conductivity type as that of the second cladding layer and a third cladding layer hereinafter described, even if the buffer layer remains after melt-back, there is no possibility of deteriorating the electrical characteristics to such a degree as to increase the series resistance of the semiconductor laser device. Therefore, some portions of the buffer layer may be left unremoved as long as the light absorption by the remaining portions of the buffer layer does not cause a substantial decrease in the amount of light emission.

Figure 1E:
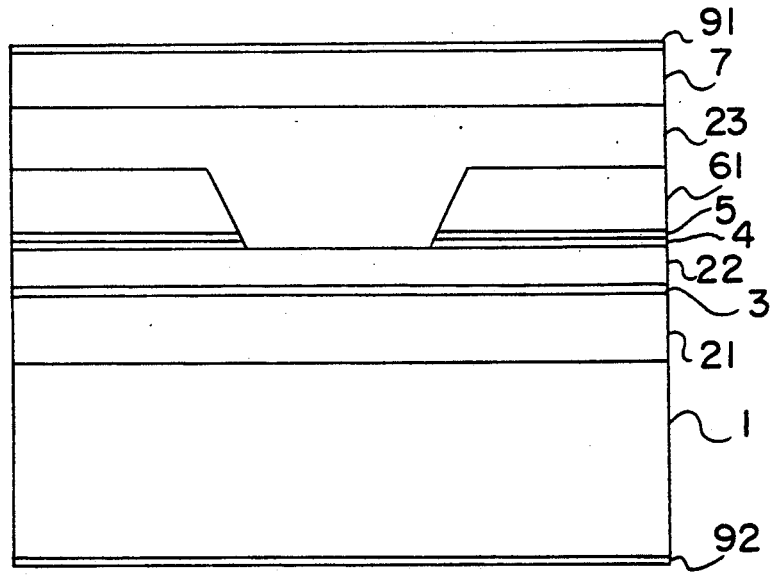

(5) Subsequently, a p-$Al_{0.50}Ga_{0.50}As$ third cladding layer 23 and a p-GaAs contact layer 7 were successively grown within the same LPE apparatus. Finally, an n-side electrode 92 was formed on the bottom surface of the n-GaAs substrate 1, and a p-side electrode 91 on the top surface of the p-GaAs contact layer 7, resulting in the semiconductor laser device shown in FIG. 1E.

In the production of this example, because the p-GaAs buffer layer 4 and the n-GaAs protective layer 101, both oxidized through exposure to air after the removal of the etching stopper layer 5 in step (3), were removed by melt-back, there occurred no crystal defects in the vicinity of the interface between the grown layers when the second epitaxial growth was performed in step (5). Therefore, deep states or non-radiative recombination centers associated with crystal defects did not occur, thus assuring the production of a semiconductor laser device with high reliability. Furthermore, because the current blocking layer 61 is hard to melt back by a Ga-Al-As melt, the width of the striped groove was not widened as a result of melt-back, which prevented the threshold current from varying within the same wafer.

EXAMPLE 2

Figure 2A:
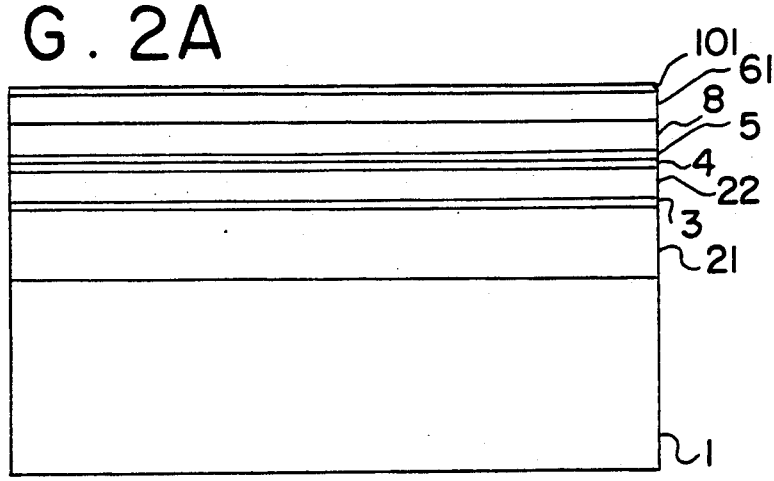
FIGS. 2A to 2E are sectional views showing the production of a semiconductor laser device according to another method of this invention.

FIGS. 2A to 2E show a series of steps in another method for the production of a semiconductor laser device according to this invention. This semiconductor laser device was produced as follows:

(1) First, as shown in FIG. 2A, on an n-GaAs substrate 1, an n-$Al_{0.50}Ga_{0.50}As$ first cladding layer 21, an $Al_{0.14}Ga_{0.86}As$ active layer 3, a p-$Al_{0.50}Ga_{0.50}As$ second cladding layer 22, a p-GaAs buffer layer 4, a p-$Al_{0.60}Ga_{0.40}As$ etching stopper layer 5, an n-GaAs light absorbing layer 8, an n-$Al_{0.20}Ga_{0.80}As$ current blocking layer 61, and an n-GaAs protective layer 101 were successively grown by the MBE method. It is desirable that the Al mole fraction in the current blocking layer be within the range of 0.05 to 0.40.

(2) A photoresist pattern 102 with a striped opening was formed on the n-GaAs protective layer 101. Using the photoresist pattern 102 as an etching mask, the n-

Figure 2B:
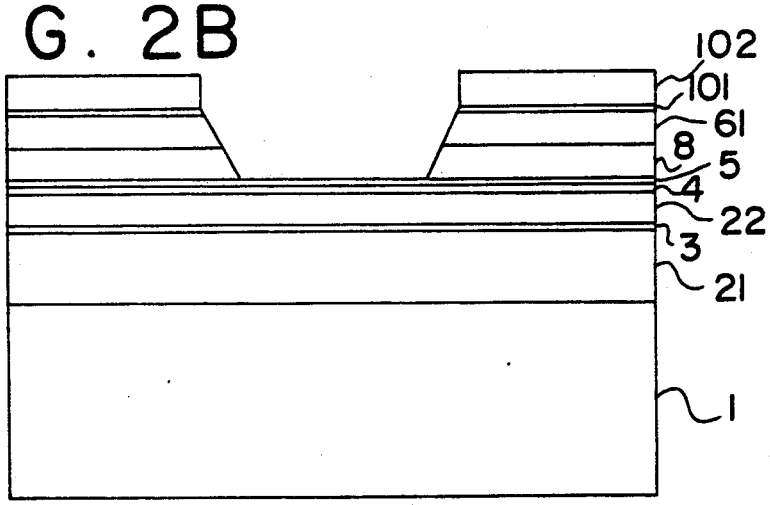

GaAs protective layer 101, the n-Al$_{0.20}$Ga$_{0.80}$As current blocking layer 61, and the n-GaAs light absorbing layer 8 were etched by photolithography, to form a striped groove reaching the p-Al$_{0.60}$Ga$_{0.40}$As etching stopper layer 5, as shown in FIG. 2B. A GaAs selective etchant, such as a mixture of ammonia water and hydrogen peroxide, was used in the etching. When the Al mole fraction in the current blocking layer is 0.3 or less, the current blocking layer can be etched using such an etchant. On the other hand, when the Al mole fraction is greater than 0.3, an aqueous solution of sulfuric acid and hydrogen peroxide or an aqueous solution of hydrochloric acid is used as the etchant to etch the current blocking layer. The cross-sectional shape of the striped groove may be in the form of either a mesa or a reversed mesa.

Figure 2C:
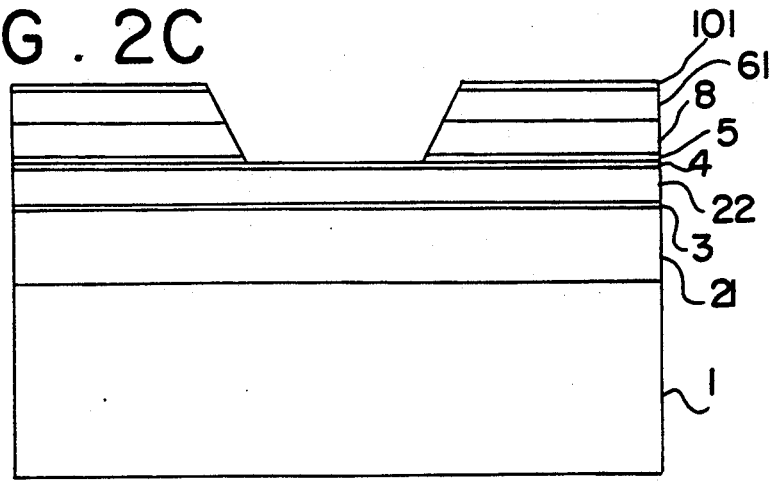

(3) After removing the photoresist pattern 102, the above-described wafer was immersed in an AlGaAs selective etchant, such as an aqueous solution of hydrofluoric acid, to remove the exposed portion of the p-Al$_{0.60}$Ga$_{0.40}$As etching stopper layer 5 on the bottom of the striped groove, as shown in FIG. 2C.

Figure 2D:
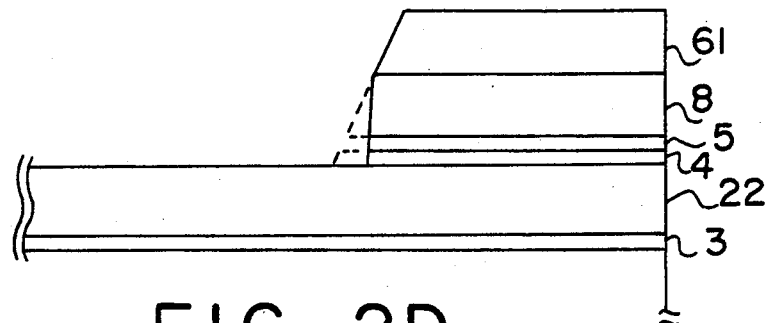
Figure 2E:
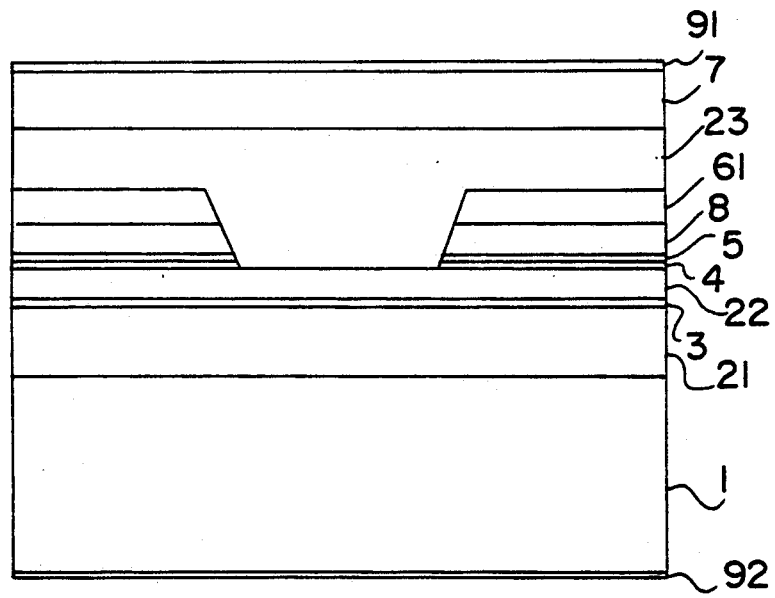
Figure 3A:
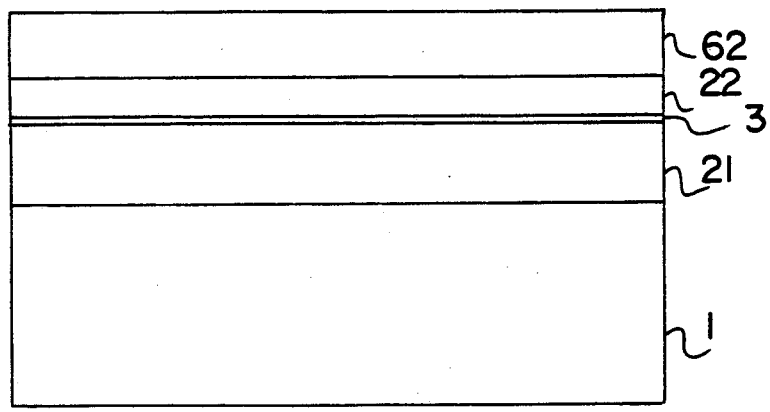
FIGS. 3A to 3C are sectional views showing the production of a semiconductor laser device according to a conventional method.
Figure 3B:
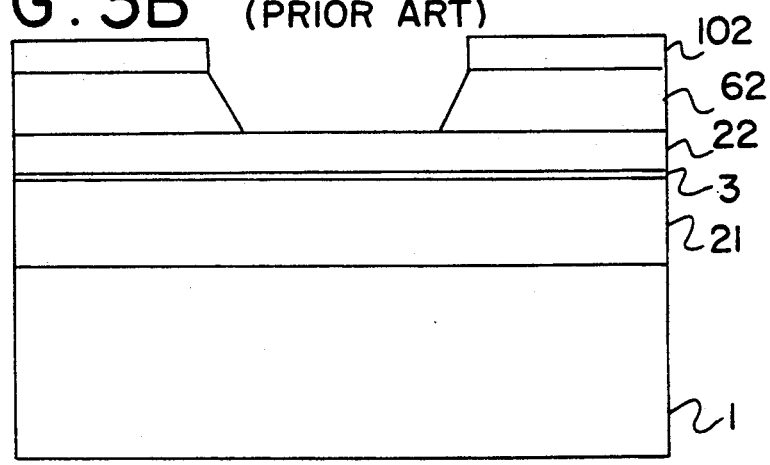
Figure 3C:
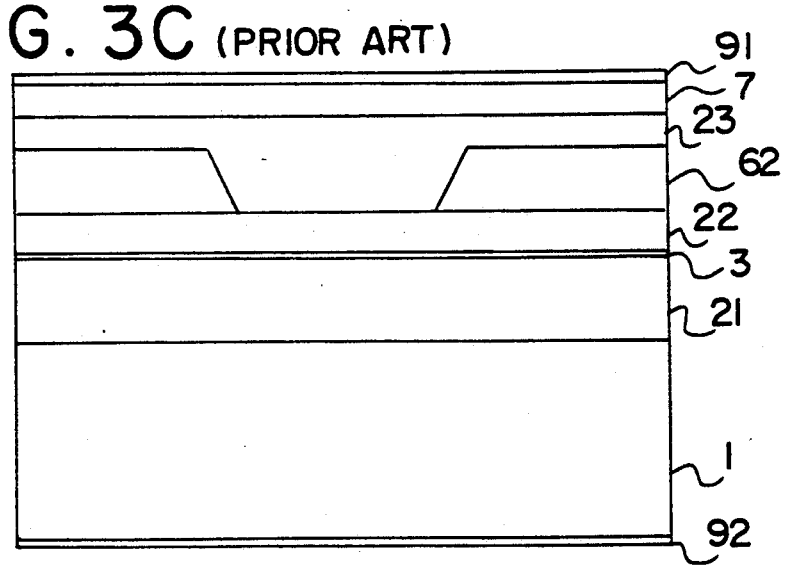
Figure 4A:
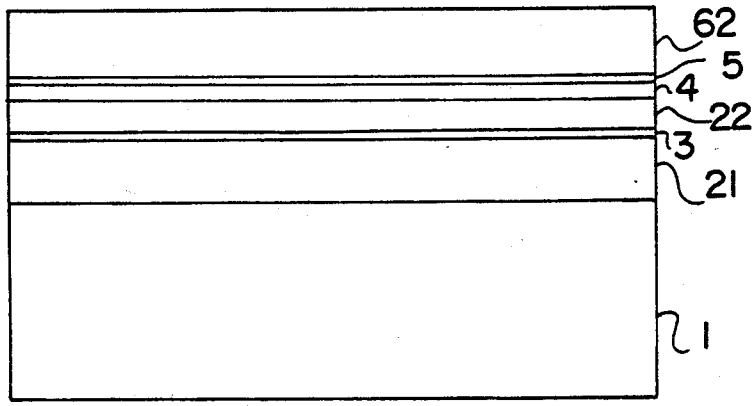
FIGS. 4A to 4E are sectional views showing the production of a semiconductor laser device according to another conventional method.
Figure 4B:
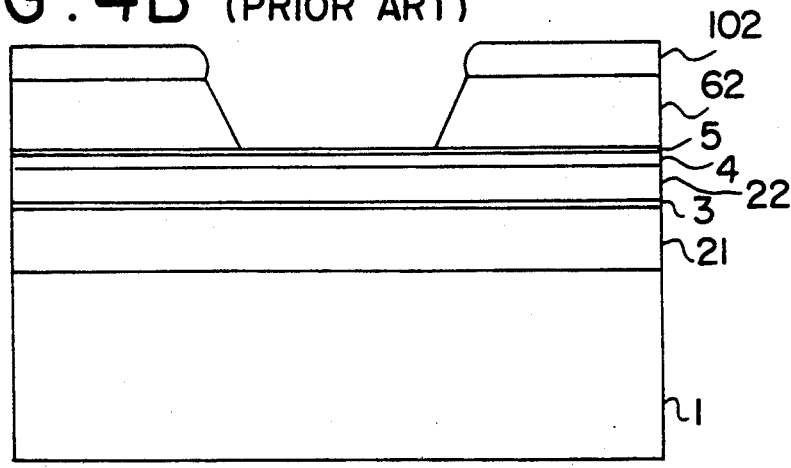
Figure 4C:
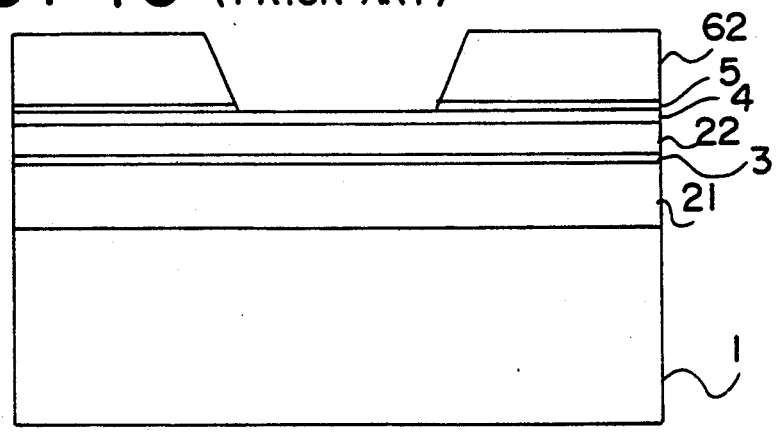
Figure 4D:
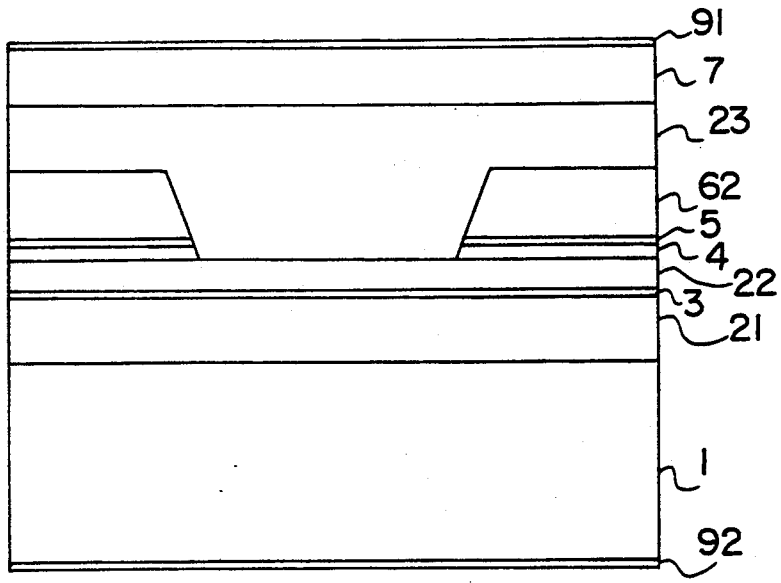
Figure 4E:
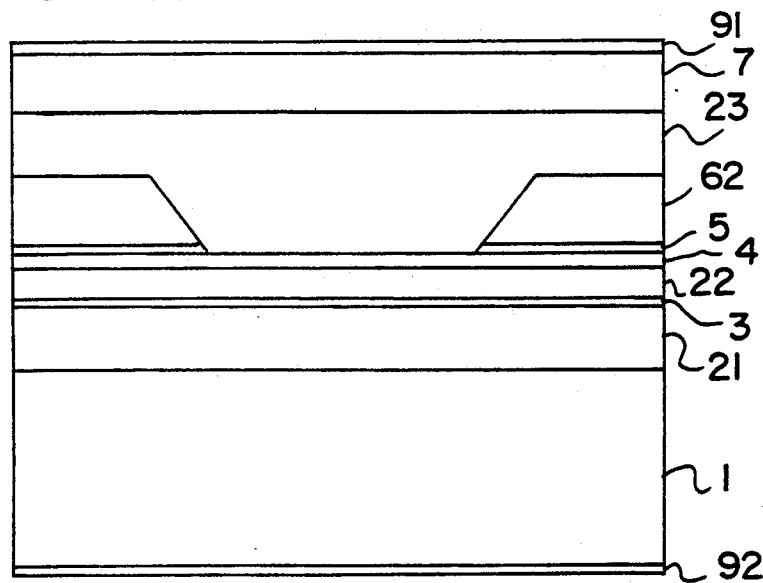

(4) The wafer thus processed was inserted into an LPE apparatus in which the wafer was placed in contact with a Ga-Al-As melt to allow the GaAs layers to melt back. The AlGaAs layers do not melt back, even if the Al mole fraction is low. As a result, the n-GaAs protective layer 101, the n-GaAs light absorbing layer 8, and the portion of the p-GaAs buffer layer 4 on the bottom of the striped groove were removed by melt-back. If the p-Al$_{0.60}$Ga$_{0.40}$As etching stopper layer 5 is recessed in the sidewalls of the striped groove by being excessively etched in the previous step (3), the n-GaAs light absorbing layer 8 recedes as a result of melt-back in this step, thereby offsetting the recess in the p-Al$_{0.60}$Ga$_{0.40}$As etching stopper layer 5, as shown in FIG. 2D.

(5) Subsequently, a p-Al$_{0.50}$Ga$_{0.50}$As third cladding layer 23 and a p-GaAs contact layer 7 were successively grown within the same LPE apparatus. Finally, an n-side electrode 92 was formed on the bottom surface of the n-GaAs substrate 1, and a p-side electrode 91 on the top surface of the p-GaAs contact layer 7, resulting in a semiconductor laser device shown in FIG. 2E.

The semiconductor laser device thus produced in this example has, underneath the current blocking layer, an n-GaAs light absorbing layer that can be easily melted back by a Ga-Al-As melt. This serves to prevent the formation of a recess in the etching stopper layer 5 and the buffer layer 4 below the current blocking layer 61, which is caused by overetching of the etching stopper layer when the Al mole fraction in the current blocking layer is substantially great. Therefore, no imperfections in crystal growth were caused which have a tendency to occur at such recessed portions, thus providing a semiconductor laser device with high reliability.

It is understood that various other modification will be apparent to and can readily be made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A semiconductor laser device comprising a semiconductor substrate and a multi-layered structure disposed on the substrate, said multi-layered structure containing an Al$_x$Ga$_{1-x}$As ($0<x<1$) first cladding layer formed on the substrate, an Al$_y$Ga$_{1-y}$As ($0<y<1, x>y$) active layer for laser oscillation formed on said first cladding layer, an Al$_x$Ga$_{1-x}$As ($0<x<1$) second cladding layer formed on said active layer, and an Al$_z$Ga$_{1-z}$As ($0<z<1$) current blocking layer formed above the second cladding layer, said current blocking layer having a striped groove as a current injection path.

2. A semiconductor laser device according to claim 1, wherein said multi-layered structure further contains a GaAs light-absorbing layer formed underneath the current blocking layer.

3. A semiconductor laser device according to claim 1, wherein the Al mole fraction z in the current blocking layer ranges from 0.05 to 0.40.

4. A method for the production of a semiconductor laser device, comprising the steps of:

forming a multi-layered structure on a semiconductor substrate, said multi-layered structure containing in order, an Al$_x$Ga$_{1-x}$As ($0<x<1$) first cladding layer, an Al$_y$Ga$_{1-y}$As ($0<y<1, x>y$) active layer for laser oscillation, an AlGaAs ($0<x<1$) second cladding layer, a GaAs buffer layer, an Al$_u$Ga$_{1-u}$As ($0<u<1$) etching stopper layer, an Al$_z$Ga$_{1-z}$As ($0<z<1, z<u$) current blocking layer, and a GaAs protective layer;

etching the protective layer and the current blocking layer to form a striped groove as a current injection path;

removing the exposed portion of the etching stopper layer on the bottom of the striped groove;

removing the portion of the buffer layer on the bottom of the striped groove and at least one part of the protective layer by a melt-back technique; and growing an Al$_x$Ga$_{1-x}$As ($0<x<1$) third cladding layer so as to bury the striped groove therein and growing a GaAs contact layer on the third cladding layer.

5. A method for the production of a semiconductor laser device according to claim 4, wherein a GaAs light-absorbing layer is formed between the etching stopper layer and the current blocking layer, and wherein the light-absorbing layer is etched together with the protective layer and the current blocking layer.

* * * * *